United States Patent [19]

Nakamura et al.

[11] Patent Number: 4,664,983

[45] Date of Patent: May 12, 1987

[54] POLYESTER COMPOSITION, THE MOLDINGS OF THE COMPOSITION AND THE PROCESS FOR MANUFACTURING OF THE MOLDINGS

[75] Inventors: Kiyokazu Nakamura; Kiichi Kometani, both of Nagoya; Toshihide Inoue, Ichinomiya, all of Japan

[73] Assignee: Toray Industries Inc., Tokyo, Japan

[21] Appl. No.: 689,667

[22] Filed: Jan. 8, 1985

[51] Int. Cl.$^4$ .............................................. B32B 15/08
[52] U.S. Cl. ..................................... 428/458; 427/307; 523/440; 523/442; 524/430; 524/497; 524/605
[58] Field of Search ................ 523/440, 442; 524/605, 524/430, 497; 427/307; 428/458

[56] References Cited

U.S. PATENT DOCUMENTS

| | | | |
|---|---|---|---|
| 3,557,039 | 1/1971 | McIntyre et al. | 524/605 |
| 3,629,365 | 12/1971 | Gardner | 524/605 |
| 3,663,449 | 5/1972 | Brinkmann | 524/497 |
| 3,960,807 | 6/1976 | McTaggart | 524/605 |
| 4,022,748 | 5/1977 | Schlichting et al. | 524/430 |
| 4,212,791 | 7/1980 | Avery et al. | 524/430 |
| 4,325,991 | 4/1982 | Donovan et al. | 427/307 |

FOREIGN PATENT DOCUMENTS

| | | | |
|---|---|---|---|
| 54-69067 | 6/1979 | Japan | 524/497 |
| 58-157827 | 9/1983 | Japan | 427/307 |
| 58-157828 | 9/1983 | Japan | 427/307 |

*Primary Examiner*—Lewis T. Jacobs
*Attorney, Agent, or Firm*—Austin R. Miller

[57] ABSTRACT

A polyester composition according to the subject invention is composed of thermoplastic polyesters and the titanium dioxide and/or aluminum oxide having specific particle diameters.

The polyester composition provides the molded articles which display reduced warpage.

The polyester composition has high plating characteristic and provide superior metal-plated moldings.

13 Claims, 2 Drawing Figures

POLYESTER COMPOSITION, THE MOLDINGS OF THE COMPOSITION AND THE PROCESS FOR MANUFACTURING OF THE MOLDINGS

BACKGROUND OF THE INVENTION

The subject invention relates to the polyester compositions reducing molding warpage and being superior in mechanical properties, surface appearance and plating characteristic; to the moldings of the compositions; and to the processes for manufacturing the moldings.

Considerably increasing in strength and flexural modulus when a reinforcement or a filler is added, the thermoplastic polyester resins represented by polybutylene terephthalate are used extensively for parts of electrical and electronic equipment, automobiles and so forth. The reinforcements and fillers such as glass fibers and micas producing reinforcing effects are known to generally have a fault of giving large warpage to their moldings because of the shapes being fibrous or laminar.

Further, the moldings of the thermoplastic polyester resinous compositions to which a reinforcement or filler is added lose smoothness of surface because they are affected thereby, they cannot be, therefore, used at all when the surface appearance and smoothness of moldings are significant.

It is proposed for reducing molding warpage to add small-anisotropy granular fillers such as calcium carbonates, clays, diatomaceous earthes, calcium metasilicates, talcs and sericites (Japanese Laid-Open Patent No. 75245/1978). This method, however, has a defect in that the thermoplastic polyester resinous compositions are neither satisfactorily practicable because of the decrease in mechanical properties such as impact strength nor improved in surface smoothness at all, although molding warpage is reduced.

The known methods for metallizing the surface of the thermoplastic polyester resins through plating include that wherein those containing a filler similar to those aforementioned are subjected to etching by using an alkaline solution and then plated (Japanese Laid-Open Patent No. 15977/1979), that wherein those being reinforced with a glass fiber and calcium carbonate are subjected to etching by using an alkaline hydroxide solution containing an oxidizing agent and then plated (Japanese Laid-Open Patent No. 6374/1978) and that those reinforced with a glass fiber are immersed in an aqueous solution of nitric acid and in an alkaline hydroxide aqueous solution in turn for etching and then plated (Japanese Laid-Open Patent No. 6376/1978). They can, however, obtain no highly practicable metal-plated thermoplastic polyester resin moldings because the adhesion and surface gloss of metal-plated layer reach no substantially effective level.

SUMMARY OF THE INVENTION

An object of the subject invention is to provide polyester resin compositions reducing molding warpage and superior in mechanical properties.

Another object of the subject invention is to provide moldings of the polyester compositions superior in surface smoothness and in plating characteristic.

A further other object of the subject invention is to provide metal-plated moldings of the polyester resin compositions being superior in adhesion of metal-plated layer and in appearance.

A further other object of the subject invention is to provide processes for manufacturing metal-plated moldings of the polyester resin compositions.

The polyester composition according to the subject invention is manufactured by blending 5 to 250 parts by weight of the titanium dioxide and/or aluminum oxide having mean particle diameters of 0.5 to 10 $\mu$m with 100 parts by weight of thermoplastic polyesters.

DESCRIPTION OF THE PREFERRED EMBODIMENTS

Figure 1:
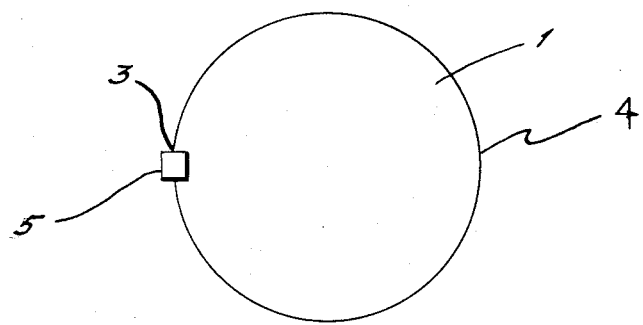
FIG. 1 is a plan of molding warpage measuring instrument.

The thermoplastic polyesters according to the subject invention are the polymers obtained by polycondensation of dicarboxylic acid components more than 90 mol percents of which are terephthalic acids and diol components.

The term terephthalic acids herein used means terephthalic acid and its ester-forming derivatives. The other dicarboxylic acid components being preferably used together therewith include aromatic dicarboxylic acids such as isophthalic acid, orthophthalic acid, 2,6-naphthalenedicarboxylic acid, 2,7-naphthalenedicarboxylic acid, 1,5-naphthalenedicarboxylic acid, bis(p-carboxyphenyl)methane, anthracenedicarboxylic acid, 4,4'-biphenyldicarboxylic acid and 1,2-bis(phenoxy)ethane-4,4'-dicarboxylic acid; aliphatic dicarboxylic acids such as adipic, sebacic, azelaic and dodecanedioic acids; cycloaliphatic dicarboxylic acids such as 1,3- and 1,4-cyclohexanedicarboxylic acids; the terephthalic and isophthalic acids containing metal salt of sulfonate such as 2-sodium sulfoterephthalate and 5-sodium sulfoisophthalate; and the like or their ester-forming derivatives.

The diol components being preferable include the aliphatic glycols having 2 to 20 carbon atoms, for example ethyleneglycol, propyleneglycol, 1,4-butanediol, neopentylglycol, 1,5-pentanediol, 1,6-hexanediol, decamethyleneglycol, cyclohexanedimethanol, cyclohexanediol and the like or their ester-forming derivatives.

The preferable polymers and copolymers of the aforementioned terephthalic acid and diol components include poly(butylene terephthalate), poly(butylene terephthalate/isophthalate), poly(butylene terephthalate/adipate), poly(butylene terephthalate/sebacate), poly(butylene terephthalate/decanedicarboxylate), poly(ethylene terephthalate), poly(ethylene terephthalate/isophthalate), poly(ethylene terephthalate/adipate), poly(butylene terephthalate/2-sodium sulfoterephthalate), poly(butylene terephthalate/5-sodium sulfoisophthalate) and poly(ethylene terephthalate/5-sodiumsulfo isophthalate). Particularly preferable thereamong are poly(butylene terephthalate) as well as the poly(butylene terephthalate/2-sodium sulfoterephthalate) and poly(butylene terephthalate/5-sodium sulfoisophthalate) wherein the copolymerization ratio of the metal sulfoterephthalate and/or metal sulfoisophthalate components is 0.05 to 10 mol percent, to the acid component.

The thermoplastic polyesters should preferably be such that their 0.5 percent o-chlorophenol solution has the relative viscosities of 1.2 to 2.0, particularly of 1.3 to 1.85, when measured at 25° C.

More than two aforementioned materials can be used mixedly.

Preferable among the titanium dioxides used according to the subject invention are the anatase and rutile type ones having the purities more than 95 percents that are manufactured by sulfate or chloride process.

The titanium dioxides are required to have the mean particle diameters ($\bar{d}$) of 0.5 to 10 μm, preferably of 1.5 to 6 μm, more preferably of 2 to 4.5 μm.

For obtaining the excellent effects of the subject invention, titanium dioxide particles should have such particle-size distributions that the content (effective particle content) of the particles having the particle diameters d(μm) expressed in terms of $\bar{d}-0.5 \leq d \leq \bar{d}+1.0$ (wherein $\bar{d}$ is mean grain diameter (μm)) is preferably more than 50, more preferably more than 65 percent by weight to total.

Particle-size distribution of the particles herein is calculated from that measured by sedimentation balance method and mean patticle diameter is expressed in terms of the particle diameter where the integrated weight of the particle-size distribution measured by sedimentation balance method corresponds to 50 percent by weight.

The aluminum oxide used according to the subject invention should be made powdery by properly crushing the aggregate of the crystalline particles of that produced by burning the aluminum hydroxide (chemical formula $Al(OH)_3$ or $Al_2O_3.3H_2O$) manufactured from bauxite.

The powdery particles of aluminum oxide is required to have the mean particle diameters of 0.5 to 10 μm preferably of 0.7 to 6 μm, more preferably of 1.4 to 4 μm.

For obtaining the effects of the subject invention, the titanium dioxide and/or aluminum oxide should preferably have the mean particle diameters of 0.5 to 10 μm. Those less than 0.5 μm are not preferable because they deteriorate impact strength, increase the warpage of moldings though ensuring surface smoothness and they tend to reduce the effect of improving the adhesion of metal-plated layer. Those more than 10 μm deteriorate impact strength and surface smoothness and tend to considerably affect the plating characteristic with respect to the adhesion and appearance of metal-plated layer.

The addition ratio of titanium dioxide and/or aluminum oxide should be 5 to 250, preferably 20 to 150, more preferably 30 to 100, parts by weight per 100 parts by weight of thermoplastic polyester. Those less than 5 parts by weight do not give sufficient rigidity to resins and reduce the effect of improving the adhesion of metal-plated layer. Those more than 250 parts by weight eliminate the surface smoothness because of the large surface roughness of moldings, considerably lower their impact strength and the plating characteristics with respect to the gloss as well as adhesion of metal-plated layer.

The compositions according to the subject invention permit the addition of 1 to 70 parts by weight of another granular and/or fibrous fillers. Preferable among granular fillers are inorganic ones such as zinc oxide, magnesium oxide, antimony trioxide, zirconium oxide, silicon oxide, potassium titanate, magnesium carbonate, calcium carbonate, calcium-magnesium carbonate, calcium metasilicate, barium sulfate, talc, kaolin, clay, silica, mica, sericite, gypsum, feldspar, vermiculite, asbestos, glass bead, glass baloon, silus balloon and carbon black, as well as organic ones such as resin particles.

Preferable among fibrous fillers are glass, metal and resin fibers.

Mixing an impact modifier selected out of the group consisting of:

(i) Aliphatic dicarboxylic acid copolymerized polyesters (ii) Polyester elastomers (iii) Olefinic copolymers containing glycidyl groups is preferable for further improvement in impact strength.

The aliphatic dicarboxylic acid copolymerized polyesters used according to the subject invention consist of dicarboxylic acid components having aliphatic and aromatic dicarboxylic acid components as well as diol components. The copolymerization ratio of the aliphatic dicarboxylic acid components should be 10 to 50, preferably 15 to 40, mol percents to the total acid components.

Preferable among aliphatic dicarboxylic acid components are those having 6 to 36 carbon atoms, including the adipic acid, sebacic acid, azelaic acid, decandioic acid, dodecanedioic acid, hexadecanedioic acid, octadecanedioic acid and dimer acid, and the like or their ester-forming derivatives.

Preferable among the aromatic dicarboxylic acid components used together with aliphatic ones are aromatic dicarboxylic acids such as terephthalic acid, isophthalic acid, orthophthalic acid, 2,6-naphthalenedicarboxylic acid, 2,7-naphthalenedicarboxylic acid, 1,5-naphthalenedicarboxylic acid, bis(p-carboxyphenyl)methane, anthracenedicarboxylic acid, 4,4'-biphenyldicarboxylic acid and 1,2-bis(phenoxy) ethane-4,4'-dicarboxylic acid; cycloaliphatic dicarboxylic acids such as 1,3-and 1,4-cyclohexanedicarboxylic acids; and their ester-forming derivatives. Preferable among the diol components are aliphatic glycols having 2 to 20 carbon atoms, for example ethyleneglycol, propyleneglycol, 1,4-butanediol, neopentylglycol, 1,5-pentanediol, 1,6-hexanediol, decamethyleneglycol, cyclohexanedimenthanol, cyclohexanediol and their ester-forming derivatives.

Preferable among the copolymers are poly(butylene terephthalate/adipate), poly(butylene terephthalate/sebacate), poly(butylene terephthalate/decanedicarboxylate), poly(butylene terephthalate/isophthalate/sebacate), poly(butylene terephthalate/isophthalate decanedicarboxyulate), poly(ethylene (terephthalate/adipate) and polyethylene terephthalate/sebacate). Particularly preferable thereamong are poly(butylene terephthalate) copolymerized polyesters represented by polybutylene (terephthalate/adipate), poly(butylene terephthalate/sebacate) and poly(butylene terephthalate/decanedicarboxylate).

The aliphatic dicarboxylic acid copolymerized polyesters should preferably be such that their 0.5 percent o-chlorophenol solution has the relative viscosities of 1.2 to 2.0, particularly of 1.3 to 1.85, when measured at 25° C.

More than two aforementioned materials can be used mixedly.

Preferable among the polyester elastomers used according to the subject invention are the polyetherester block copolymer, polyester-ester block copolymer and polyetherester-ester block copolymers having a hard segment of aromatic polyesters and a soft segment of poly(alkylene oxide)glycol and/or aliphatic polyesters. The former are the polymers obtained by polycondensation of dicarboxylic acid components more than 60 mol percent of which are terephthalic acids and diol components. Other dicarboxylic acid components than terephtalic acids and diol components for preparing the aromatic polyesters are the components usable in aforementioned thermoplastic polyester.

Preferable among the aromatic polyesters are poly(ethylene terephthalate), poly(butylene terephthalate), poly(ethylene terephthalate/isophthalate) and poly(butylene terephthalate/isophthalate).

Preferable among the soft segment poly(alkylene oxide) glycol and aliphatic polyesters are poly(ethyleneglycol), poly(1,2- and 1,3-propylene oxide)-glycol, poly-(tetramethylene oxide)-glycol, ethylene oxide-propylene oxide copolymer, ethylene oxide-tetrahydrofuran copolymer, poly(ethylene adipate), poly(butylene adipate), poly(ε-caprolactone) and poly(ethylene sebacate) and poly(butylene sebacate).

The weight ratio of the soft segment to the hard segment of the polyester elastomer should be preferably in a range from 95/5 to 10/90, more preferably 90/10–30/70.

Preferable among the polyester elastomers are poly(ethylene terephthalate)-poly(tetramethylene oxide)-glycol, poly(ethylene terephthalate/isophthalate)-poly(tetramethylene oxide)glycol, poly(butylene terephthalate)-poly(tetramethylene oxide)glycol, poly(butylene terephthalate/isophthalate)-poly (tetramethylene oxide)glycol, poly(butylene terephthalate/decanedicarboxylate)-poly(tetramethylene oxide)glycol, poly(butlene terephthalate)-poly(propylene oxide/ethylene oxide)glycol, poly(butylene terephthalate/isophthalate)-poly(propylene oxide/ethylene oxide)glycol, poly(butylene terephthalate/decane dicarboxylate)-poly(propylene oxide/ethylene oxide)glycol, poly(butylene terephthalate)-poly(ethylene oxide)glycol, poly(butylene terephthalate)-poly(ethylene adipate), poly(butylene terephthalate)-poly(butylene adipate), poly(butylene terephthalate)-poly(butylene sebacate) and poly(butylene terephthalate)-poly(ε-caprolactone) block copolymers.

Particularly preferable thereamong are poly(ethylene terephthalate)-poly(tetramethylene oxide)glycol, poly(butylene terephthalate/isophthalate)-poly(tetramethylene oxide)glycol, poly(butylene terephthalate)-poly(propylene oxide/ethylene oxide)glycol, poly(butylene terephthalate/isophthalate)-poly(propylene oxide/ethylene oxide)glycol, poly(butylene terephthalate)-poly(butylene adipate) and poly(butylene terephthalate)-poly(ε-caprolactone) block copolymers.

The polyester elastomers should have the relative viscosities measured in the same manner as the aforementioned thermoplastic polyesters of 1.4 to 4.0, preferably of 1.6 to 3.0.

The polyester elastomers can be used mixedly.

The Olefinic copolymer containing glycidyl groups used according to the subject invention mainly contains the α-olefins and glycidyl esters of α,β-ethylenically unsaturated carboxylic acid having 2 to 10 carbon atoms. The former include ethylene, propylene and butene-1. The first is preferable thereamong. The latter are the compounds represented by general formula:

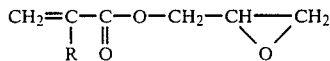

(Wherein R is a hydrogen atom, a lower alkyl radical or a lower alkyl radical having a substituted glycidyl ester radical.) They include glycidyl acrylate, glycidyl methacrylate, glycidyl ethacrylate and glycidyl itaconate. The second is preferable thereamong. The copolymerization ratio of glycidyl ester of α, β-ethylenically unsaturated acid in the olefinic copolymer containing glycidyl groups should be 0.5 to 50, preferably 1 to 20, percent by weight. Polymerizable with the aforementioned copolymers are 0.1 to 30 percent by weight of more than one selected from the group consisting of unsaturated monomers, for example vinyl esters such as vinyl ether, vinyl acetate and vinyl propionate; acrylate and methacrylate esters such as methyl, ethyl, propyl and butyl; acrylonitrile; styrene; and carbon monoxide and the like.

Preferable among the olefinic copolymers containing glycidyl groups according to the subject invention are ethylene/glycidyl methacrylate, ethylene/vinyl acetate/glycidyl methacrylate, ethylene/carbon monoxide/glycidyl methacrylate, ethylene/glycidyl acrylate and ethylene/glycidyl acrylate/vinyl acetate ones. They can be used more than two mixedly.

The olefinic copolymers containing glycidyl groups can be further increased in impact strength when the compounds accelerating the reaction between epoxy compounds and carboxylic acids is added. They include tertiary amines such as triphenyl amine and 2,4,6-tris(dimethylaminomethyl)phenol, phosphite esters such as triphenyl phosphite and triisodecyl phosphite, phosphonium compounds such as triphenylallylphosphonium bromide, tertiary phosphines such as triphenyl phosphine, metal carboxylates such as lithium stearate and calcium stearate, metal sulfonates such as sodium dodecylbenzene sulfonate and sodium 3,5-dicarbomethoxybenzene sulfonates, and organic sulfate salts such as sodium lauryl sulfate. They should be preferably added at the ratios of 0.001 to 5 parts by weight to 100 parts by weight of polyesters.

The content ratio of an impact modifier selected out of the group consisting of:

(i) Aliphatic dicarboxylic acid copolymerized polyester (ii) Polyester elastomer (iii) Polyolefinic copolymers containing glycidyl groups should be preferably 1 to 100, more preferably 3 to 50, parts by weight to 100 parts of the thermoplastic polyesters.

The content ratios less than 1 by weight results very small increase in impact strength, while more than 100 parts by weight obstructs the original thermal stability and rigidity of the thermoplastic polyesters.

The compositions according to the subject invention permit the addition at such ratios that its objects are not obstructed of more than one selected out of the group consisting of the ordinary additives of antioxidants and heat stabilizers (e.g. hindered phenol, hydroquinone, thioether, phosphites, and their derivatives and combinations), ultraviolet absorbers (e.g. resorcinols, salicilate, benzotriazole and benzophenone), lubricants and mold release agents (e.g. stearic acid and stearate, montanic acid and its salts, ester, half-ester, stearyl alcohol and stearamide), dyes (e.g. nitrosyn), colorants including pigments (e.g. cadmium sulfide, phthalocyanine and carbon black), flame retardants (e.g. decabromodiphenyl ether, brominated polycarbonate and other halogen substituted aromatic compound, melamine compound, cyanuric acid derivative and phosphoric compound), flame retarding agents (e.g. antimony oxide), antistatic agents (e.g. sodium dodecylbenzene sulfonate and polyalkyleneglycol) and nucleating agents. Further, it permits the addition of a small quantity of other thermoplastic resins (e.g. polyethylene, polypropylene, acrylic resins, fluorine containing resins, polyamide, polyacetal, polycarbonate, polysulfone and polyphenylene oxide), thermosetting resins (e.g. phenolic, melamine and epoxy resins) and elastomeric resins (e.g. ethylene/vinyl acetate copolymers). More than two selected out of the group consisting of the resins can be used mixedly.

The processes for manufacturing the compositions according to the subject invention are not limited. A material obtained by blending thermoplastic polyesters, impact modifiers, titanium dioxide and/or aluminum oxide, and other additives together can be supplied to a screw extruder for blending by melt-extrusion.

The compositions according to the subject invention enable the moldings having a desired shape to be obtained by adopting a desired resin injection, extrusion or blow-in molding methods.

In the process for manufacturing metal-plated moldings wherein the moldings of the compositions according to the subject invention are subjected to etching and metallization, it is necessary to use a more than pH8 alkaline solution for the former. It is obtained by dissolving an alkali component such as potassium hydroxide, sodium hydroxide or magnesium hydroxide in a solvent such as water, phenols, alcohols or their mixtures for 1 to 60 percent by weight concentrations. Preferable thereamong are the aqueous solution of 10 to 40 percent by weight of sodium and/or potassium hydrides.

Surface-active agents can be added if necessary.

The conditions of the treatment with an alkaline solution according to the subject invention: the moldings should be kept in contact with an alkaline solution preferably at 5° to 95° C. for 1 to 120 minutes, more preferably at 30° to 80° C. for 3 to 60 minutes.

It is preferable therein to carry out the treatment with an acidic solution before or after the surface etching by using an alkaline solution. It can increase the adhesion between surface metal layer and substrate. The acidic solution should preferably contain more than one selected from sulfuric, nitric, hydrochloric, phosphoric or another mineral acid and water as main components, the acid concentration amounting to 2 to 90 percent by weight. They should more preferably contain more than one hexavalent chromium compounds.

Hexavalent chromium compounds include chromium trioxide, chromates (e.g. potassium chromate and sodium chromate), dichromates (e.g. potassium dichromate and sodium dichromate). Preferable thereamong are chromium trioxide, potassium dichromate and sodium dichromate. They should have the concentrations preferably of 0.02 to 50, more preferably of 0.2 to 50, percent by weight in the acidic solution.

The conditions of the treatment with an acidic solution: the moldings should be immersed preferably at 5° to 95° C. for 0.20 to 120 minutes, more preferably at 20° to 90° C. for 1 to 60 minutes.

Wet plating is preferable for the metalizing after etching. Ordinary plating method ensures considerably superior adhesion of metal-plated layer and the manufacture of the metal-plated theremoplastic polyester resin moldings being superior in surface gloss. Applicable thereto are ordinary metal-plating processes consisting of the steps of the sensitizing by stannous chloride solution, of activating by palladium chloride solution, of electroless plating of copper or nickel and of electroplating, or of the steps of catalysting, of accelerating, of electroless plating and of electroplating.

The compositions according to the subject invention that are obtained by blending the particles of the titanium dioxide and/or aluminum oxide having specific particle diameters with the thermoplastic polyesters reduce the warpage of their moldings as well as increase them in mechanical strength and surface smoothness at the same time.

The metal-plated moldings obtained by plating the moldings of the compositions according to the subject invention ensure superior plating adhesion and appearance simultaneously. The subject invention will be described in further details in connection with its embodiments hereinafter.

Therein, symbols indicate:
A: titanium dioxide
B: aluminum oxide
C: glass fiber
D: glass bead
E: clay
F: talc
G: calcium methasilicate
P: poly(butylene terephthalate/decanedicarboxylate) (copolymerization mol ratio of terephthalic acid/decanedicarboxylic acid component=80/20)
Q: ethylene/glycidyl methacrylate copolymer (copolymerization ratio by weight =90/10)
R: poly(butylene terephthalate)-poly(tetramethylene oxide)glycol block copolymer (soft/hard segment ratio by weight =40/60)

EXAMPLES 1 TO 7, COMPARATIVE EXAMPLES 1 to 13

The titanium dioxide and other fillers having such mean particle diameters as shown in Table 1 were dry blended with 100 parts by weight of poly(butylene terephthalate) having a relative viscosity of 1.57 at such ratios as shown in the table 1 and subjected to the melting, mixing and pelletizing by an extruder having a 40 mm$\phi$ screw that was set to 250° C.

The pellets obtained were subjected to an injection molding machine set to 250° C. at a mold temperature of 80° C. for manufacturing a 125 mm$\phi \times$ 2 mm (thickness) disc (specimen A), a $\frac{1}{2}''\times 2\frac{1}{2}''\times \frac{1}{8}''$ mold-notched impact strength testing specimen (specimen B), a $\frac{1}{4}''\times \frac{1}{2}''\times 5''$ flexural properties testing specimen (specimen C) and a 80 mm$\times$90 mm$\times$2 mm (thickness) square plate (specimen D).

Figure 2:
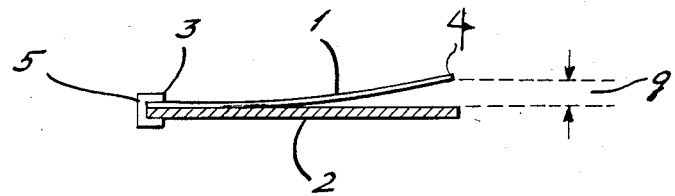
FIG. 2 is a cross-sectional view of the aforesaid instrument.

Specimen A was used as test sample 1 for evaluating molding warpage. The test sample 1 was put stationary on the reference surface 2 as shown in FIGS. 1 and 2, one point 3 on the circumference thereof was fastened to the reference surface 2 by using a fastener 5, the clearance (g) of another point 4 on the diametric circumference thereof with the reference surface 2 was measured and molding warpage was evaluated in terms of the value in percentage of the ratio of the clearance (g) to its diameter (effective molding warpage: less than 0.5%).

Impact strength was evaluated in terms of the measured Izod impact strength of specimen B according to the method of ASTM D-256.

Surface smoothness of moldings: the surface roughness of specimen A was measured by using a surface texture mesuring system manufactured by Tokyo Seimitsu Co. Ltd and it was evaluated in terms of the difference (Rmax) between the highest raise and lowest recess of their surface (effective surface roughness Rmax: less than 2.0 μm).

Rigidity was evaluated in terms of the measured flexural modulus of specimen C according to the method of ASTM D-790.

Plating characteristic: specimen D was subjected to such plating method as shown in Table 4 including the 10 minutes' 70° C. etching by using an alkaline solution composed of 35 percent by weight of NaOH and 65 percent by weight of $H_2O$.

TABLE 4

| Treating Procedure | Plating Procedure Substrates in Treating Bath | Treating Condition |
| --- | --- | --- |
| (1) Degreasing | — | — |
| Rinse | | |
| (2) Etching | | |
| Rinse | | |
| (3) Neutralization | (36% HCl) 20 ml/l | 25° C., 2 minutes |
| Rinse | | |
| (4) Catalysting | — | — |
| Rinse | | |
| (5) Accelerating | (98% $H_2SO_4$) 100 ml/l | 45° C., 4 minutes |
| Rinse | | |
| (6) Electroless plating | Chemical nickel | 42° C., 8 minutes |
| Rinse | | |
| (7) Activation | (98% $H_2SO_4$) 50 g/l | 30 seconds |
| Rinse | | |
| (8) Electroplating (glossy copper) | $H_2SO_4$ (98%) 50 g<br>$CuSO_4 \cdot 5H_2O$ 200 g<br>*SCB-MU 10 ml<br>*SCB-1 1 ml<br>Water 1000 g | 30° C. Copper plating up to 30μ thickness at current density 4 A/dm² |
| Rinse | | |
| (9) Electroplating (glossy nickel) | Boric acid 40 g<br>$NiCl_2 \cdot 6H_2O$ 50 g<br>$NiSO_4 \cdot 7H_2O$ 300 g<br>*Monolite 1 ml<br>*Acna B-1 20 ml<br>Water 1000 g | 50° C. Copper plating up tp 15μ thickness at current density 5 A/dm² |
| Rinse | | |
| (10) Electroplating (chrome) | $H_2SO_4$ (98%) 5 g<br>$CrO_3$ 250 g<br>Water 1000 g | 50° C. Chrome plating up to thickness 0.2μ at current density 40 A/dm² |
| Rinse | | |

*Plating reagent solution manufactured by Okuno Chemical Industries.

The adhesion of metal-plated layer was evaluated in terms of the measured force (kg) for the 10 mm-wide and 20 mm-long T-peeling of the metal-plated layer of specimen D subjected up to the aforementioned (8) electroplating (glossy copper).

The appearance test of plating: the gloss of the specimen D subjected up to (10) electroplating (chrome) was naked-eye observed and evaluated.

Thermal cycle test of plating: the specimen D subjected up to (10) electroplating (chrome) was subjected to three cycles of the exposure to 100° C. (1 hr.) and −30° C. (1 hr.) and, if nothing abnormal occurred(test 1), to continuous three cycles of the exposure to 130° C. (1 hr.) and −30° C. (1 hr.) and whether any abnormality occurred at its surface was naked-eye observed(test 2). The results of this test are shown in Table 1.

EXAMPLES 8 TO 14, COMPARATIVE EXAMPLES 14 to 19

Such impact modifiers as shown in Table 2 as well as titanium dioxide, aluminum oxide and other fillers having such mean particle diameters as shown in Table 2 were dry blended with 100 parts by weight of the poly(butylene terephthalate) having a relative viscosity of 1.57 at such ratios as shown in Table 1 and subjected to the melting, mixing and pelletizing by an extruder having a 40 mmφ screw that was set to 250° C.

The pellets obtained were subjected to an injection molding machine set to 250° C. at a model temperature of 80° C. for manufacturing a 125 mmφ×2 mm (thickness) disc (specimen A), a ½"×2½"×⅛" mold notched impact strength testing specimen (specimen B), a ¼"×½"×5" flexural properties testing specimen (specimen C) and a 80 mm×90 mm×2 mm (thickness) square plate (specimen D).

The specimens were evaluated in the same manner as Example 1. The results of this evaluation are shown in Table 2.

EXAMPLES 15 TO 21, COMPARATIVE EXAMPLES 20 TO 22

Such impact modifiers as shown in Table 3 as well as titanium dioxide, aluminum oxide and other fillers having such mean particle diameters as shown in the Table 3 were dry blended with 100 parts by weight of the poly(butylene terephthalate) having a relative viscosity of 1.57 at such ratios as shown in Table 1 and subjected to the melting, mixing and pelletizing by an extruder having a 40 mmφ screw that was set to 250° C.

The pellets obtained were subjected to an injection molding machine set to 250° C. at a mold temperature of 80° C. for manufacturing a 80 mm×90 mm×2 (thicknes) square plate (specimen D). Their characteristic of the plating after subjected to the plating procedure described in Table 4 including etching by using the acidic and alkaline solutions having compositions:

| AC: | $CrO_3$ | 3% (wt) |
| --- | --- | --- |
| | $H_2SO_4$ (98%) | 50% (wt) |
| | $H_2O$ | 47% (wt) |
| BC: | NaOH | 20% (wt) |
| | $H_2O$ | 80% (wt) | under such conditions as shown in Table 3 was evaluated. The results of this evaluation are shown in Table 3.

TABLE 1

| | Example | | | | | | | Comparative Example | | |
| --- | --- | --- | --- | --- | --- | --- | --- | --- | --- | --- |
| | 1 | 2 | 3 | 4 | 5 | 6 | 7 | 1 | 2 | 3 |

TABLE 1-continued

| Composition | | | | | | | | | | |
|---|---|---|---|---|---|---|---|---|---|---|
| Poly(butylene terephthalate) (parts) | 100 | 100 | 100 | 100 | 100 | 100 | 100 | 100 | 100 | 100 |
| Filler | A | B | A | A | B | B | A,G | A | A | B |
| (parts) | 65 | 65 | 30 | 150 | 30 | 150 | 55 10 | 65 | 65 | 65 |
| Mean particle diameter of filler ($\mu$m) | 3.0 | 1.9 | 3.0 | 3.0 | 1.9 | 1.9 | 3.0 10 | 0.3 | 12 | 0.2 |
| Molding warpage (%) | 0.20 | 0.20 | 0.32 | 0.20 | 0.29 | 0.20 | 0.36 | 0.63 | 0.60 | 0.65 |
| Izod impact Strength (notched) (kg.cm/cm) | 4.5 | 4.3 | 4.9 | 4.0 | 4.5 | 4.0 | 5.0 | 2.3 | 1.8 | 2.5 |
| Surface smoothness Rmax ($\mu$m) | 0.5 | 0.5 | 0.5 | 0.8 | 0.5 | 0.8 | 0.8 | 0.6 | 3.3 | 0.5 |
| Flexural modulus $\times 10^4$ (kg/cm$^2$) | 5.0 | 5.2 | 3.5 | 6.5 | 3.6 | 6.7 | 7.0 | 4.7 | 5.1 | 4.8 |
| Plating characteristic | | | | | | | | | | |
| Adhesion (kg/cm) | 2.7 | 2.0 | 2.5 | 2.7 | 1.3 | 1.9 | 2.0 | 0.5 | <0.1 | 0.5 |
| Appearance | o | o | o | o | o | o | o | o | x | o |
| Heat cycle | | | | | | | | | | |
| test 1 | o | o | o | o | o | o | o | x | x | x |
| 2 | x | x | x | x | x | x | x | — | — | — |

| | Comparative Example | | | | | | | | | |
|---|---|---|---|---|---|---|---|---|---|---|
| | 4 | 5 | 6 | 7 | 8 | 9 | 10 | 11 | 12 | 13 |
| Composition | | | | | | | | | | |
| Poly(butylene terephthalate) (parts) | 100 | 100 | 100 | 100 | 100 | 100 | 100 | 100 | 100 | 100 |
| Filler | B | A | A | B | B | C | D | E | F | G |
| (parts) | 65 | 3 | 300 | 3 | 300 | 50 | 65 | 65 | 65 | 65 |
| Mean particle diameter of filler ($\mu$m) | 15 | 3.0 | 3.0 | 1.9 | 1.9 | — | 20 | 3.0 | 4.0 | 10 |
| Molding warpage (%) | 0.61 | 0.23 | 0.23 | 0.21 | 0.22 | 3.20 | 0.61 | 0.93 | 1.83 | 1.93 |
| Izod impact Strength (notched) (kg.cm/cm) | 1.7 | 3.7 | 1.5 | 3.7 | 1.4 | 11.8 | 1.8 | 1.8 | 1.5 | 1.6 |
| Surface smoothness Rmax ($\mu$m) | 3.5 | 0.3 | 3.9 | 0.4 | 4.3 | 9.5 | 5.9 | 5.1 | 6.1 | 5.8 |
| Flexural modulus $\times 10^4$ (kg/cm$^2$) | 5.3 | 2.4 | 7.8 | 2.4 | 7.9 | 9.5 | 5.8 | — | — | 5.9 |
| Plating characteristic | | | | | | | | | | |
| Adhesion (kg/cm) | 0.1 | <0.1 | 0.2 | 0.1 | 0.3 | 0.3 | 0.3 | <0.1 | <0.1 | 0.3 |
| Appearance | x | o | x | o | x | x | x | x | x | x |
| Heat cycle | | | | | | | | | | |
| test 1 | x | x | x | x | x | x | x | x | x | x |
| 2 | — | — | — | — | — | — | — | — | — | — |

Appearance: o Excellent, x Granular
Heat cycle test: o All passed, x Such abnormalities as swell, crack, crinkle and peel occurred.

TABLE 2

| | Example | | | | | | | Comparative Example | | | | | |
|---|---|---|---|---|---|---|---|---|---|---|---|---|---|
| | 8 | 9 | 10 | 11 | 12 | 13 | 14 | 14 | 15 | 16 | 17 | 18 | 19 |
| Composition | | | | | | | | | | | | | |
| Poly (butylene terephthalate) (parts) | 100 | 100 | 100 | 100 | 100 | 100 | 100 | 100 | 100 | 100 | 100 | 100 | 100 |
| Filler | A | B | A | B | A | B | A,G | A | A | A | A | A | A |
| (parts) | 80 | 80 | 80 | 80 | 80 | 80 | 70 10 | 80 | 80 | 80 | 80 | 80 | 80 |
| Mean particle diameter of filler ($\mu$m) | 3.0 | 1.9 | 3.0 | 1.9 | 3.0 | 1.9 | 3.0 10 | 3.0 | 3.0 | 3.0 | 3.0 | 3.0 | 3.0 |
| Impact modifier | P | P | Q | Q | R | R | Q | P | P | Q | Q | R | R |
| (parts) | 20 | 20 | 20 | 20 | 10 | 10 | 10 | 0.5 | 150 | 0.5 | 150 | 0.5 | 150 |

TABLE 2-continued

|  | Example | | | | | | | Comparative Example | | | | | |
| --- | --- | --- | --- | --- | --- | --- | --- | --- | --- | --- | --- | --- | --- |
|  | 8 | 9 | 10 | 11 | 12 | 13 | 14 | 14 | 15 | 16 | 17 | 18 | 19 |
| Molding warpage (%) | 0.26 | 0.25 | 0.25 | 0.26 | 0.27 | 0.26 | 0.38 | 0.23 | 0.39 | 0.23 | 0.39 | 0.25 | 0.40 |
| Izod impact strength (notched) (kg.cm/cm) | 8.7 | 7.7 | 10.3 | 10.5 | 12.6 | 11.6 | 9.7 | 4.8 | 12.1 | 4.5 | 12.2 | 4.8 | 4.8 |
| Surface smoothness Rmax ($\mu$m) | 0.5 | 0.5 | 0.5 | 0.5 | 0.6 | 0.6 | 0.8 | 0.6 | 0.6 | 0.6 | 0.6 | 0.6 | 0.6 |
| Flexural modulus $\times 10^4$ (kg/cm$^2$) | 3.5 | 3.6 | 3.4 | 3.4 | 3.3 | 3.4 | 4.0 | 5.0 | 1.0 | 4.9 | 1.0 | 4.7 | 0.9 |
| Plating characteristic |  |  |  |  |  |  |  |  |  |  |  |  |  |
| Adhesion (kg/cm) | 2.3 | 2.0 | 2.1 | 1.9 | 1.9 | 1.7 | 1.9 | 2.4 | 1.5 | 2.2 | 1.5 | 2.1 | 0.2 |
| Appearance | o | o | o | o | o | o | o | o | o | o | o | o | Δ |
| Heat cycle test 1 | o | o | o | o | o | o | o | o | x | o | x | o | x |
| 2 | o | o | o | o | o | o | o | x | — | x | x | x | x |

Appearance: o Excellent, Δ Good, x Granular
Heat cycle test: o All passed, x Such abnormalities as swell, crack, crinkle and peel occurred.

TABLE 3

|  | Example | | | | | | | Comparative Example | | |
| --- | --- | --- | --- | --- | --- | --- | --- | --- | --- | --- |
|  | 15 | 16 | 17 | 18 | 19 | 20 | 21 | 20 | 21 | 22 |
| Composition |  |  |  |  |  |  |  |  |  |  |
| Poly (butylene terephthalate) (parts) | 100 | 100 | 100 | 100 | 100 | 100 | 100 | 100 | 100 | 100 |
| Filler | A | B | A | A | B | A | A.G | C | D | E |
| (parts) | 65 | 65 | 80 | 80 | 80 | 80 | 70 10 | 50 | 65 | 65 |
| Mean particle diameter of filler ($\mu$m) | 3.0 | 1.9 | 3.0 | 3.0 | 1.9 | 3.0 | 3.0 10 | — | 20 | 3.0 |
| Impact modifier | — | — | P | Q | Q | R | — | — | — | — |
| (parts) | — | — | 20 | 20 | 20 | 10 | — | — | — | — |
| Etching condition |  |  |  |  |  |  |  |  |  |  |
| AC Treating temperature (°C.) |  |  |  | 65 |  |  |  |  | 65 |  |
| Treating time (minutes) |  |  |  | 5 |  |  |  |  | 5 |  |
| BA Treating temperature (°C.) |  |  |  | 65 |  |  |  |  | 65 |  |
| Treating time (minutes) |  |  |  | 20 |  |  |  |  | 20 |  |
| Plating characteristic |  |  |  |  |  |  |  |  |  |  |
| Adhesion (kg/cm) | 3.0 | 2.5 | 3.0 | 2.9 | 2.6 | 2.2 | 2.0 | 1.0 | 1.1 | 1.0 |
| Appearance | o | o | o | o | o | o | o | x | x | x |
| Heat cycle test 1 | o | o | o | o | o | o | o | x | x | x |
| 2 | o | o | o | o | o | o | o | x | x | x |

Appearance: o Excellent, x Granular
Heat cycle test: o All passed, x Such abnormalities as swell, crack, crinkle and peel occurred.

We claim:

1. A metal-plated molding comprising an extrusion molded or injection molded polyester composition comprising 100 parts by weight of thermoplastic polyester and, in a uniform dispersion, about 30 to 100 parts by weight of an oxide having a mean particle diameter of 0.5 to 10 $\mu$m, said oxide being selected from the group consisting of titanium dioxide and aluminum oxide and said molding having a metal plated surface.

2. The metal-plated molding comprising an extrusion molded injection molded polyester composition, as claimed in claim 1, wherein said thermoplastic polyester is poly(alkylene terephthalate).

3. The metal-plated molding comprising an extrusion molded or injection molded polyester composition, as claimed in claim 2, wherein said poly(alkylene terephthalate) is poly(butylene terephthalate).

4. The metal-plated molding comprising an extrusion molded or injection molded polyester composition, as claimed in claim 3, wherein said poly(butylene terephthalate) contains metal sulfoisophthalate and/or sulfoterephthalate as copolymerized components.

5. The metal-plated molding comprising an extrusion molded or injection molded polyester composition, as claimed in claim 1, wherein said titanium dioxide has the mean particle diameters of 1.5 to 6 $\mu$m.

6. The metal-plated molding comprising an extrusion molded or injection molded polyester composition, as claimed in claim 1, wherein said aluminum oxide has the mean particle diameters of 0.7 to 6 $\mu$m.

7. The metal-plated molding comprising an extrusion molded or injection molded polyester composition, as claimed in claim 1, wherein said aliphatic dicarboxylic acid copolymerized polyester has aliphatic diacarboxylic acid and aromatic diacarboxylic acid components.

8. The metal-plated molding comprising in extrusion molded or injection molded polyester composition, as claimed in claim 1, wherein said polyester elastomer is a block copolymer containing a hard segment of aromatic polyesters and a soft segment of poly(alkylene oxide) glycol and/or aliphatic polyesters.

9. The metal-plated molding comprising an extrusion molded or injection molded polyester composition, as claimed in claim 2, wherein said olefinic copolymer containing glycidyl groups is a copolymer of the $\beta$-olefin having 2 to 10 carbon atoms and glycidyl ester of $\alpha,\beta$-ethylenically unsaturated carboxylic acid.

10. A metal-plated molding comprising an extrusion molded or injection molded polyester composition as claimed in claim 1, further comprising 1 to 100 parts by weight of at least one impact modifier selected from the group consisting of:
   (i) aliphatic dicarboxylic acid copolymerized polyester,
   (ii) polyester elastomer,
   (iii) olefinic copolymer containing glycidyl groups.

11. A process for manufacutring metal-plated moldings, wherein the extrusion moldings or injection moldings of the polyester composition comprising 100 parts by weight of thermoplastic polyester and about 30 to 100 parts by weight of titanium dioxide and/or aluminum oxide having the mean particle diameters of 0.5 to 10 μm are etched on the surface by using an alkaline solution and then said etched surface is plated.

12. A process for manufacturing metal-plated moldings, as claimed in claim 11, wherein etching is performed after treating by an acidic solution.

13. A process for manufacturing metal-plated moldings, as claimed in claim 11, wherein etching is performed before treating by an acidic solution.

* * * * *